United States Patent [19]

Beam, III et al.

[11] Patent Number: 5,084,409
[45] Date of Patent: Jan. 28, 1992

[54] METHOD FOR PATTERNED HETEROEPITAXIAL GROWTH

[75] Inventors: Edward A. Beam, III; Yung-Chung Kao, both of Dallas, Tex.

[73] Assignee: Texas Instruments Incorporated, Dallas, Tex.

[21] Appl. No.: 543,644

[22] Filed: Jun. 26, 1990

[51] Int. Cl.⁵ .................. H01L 21/20; H01L 21/308
[52] U.S. Cl. ........................ 437/80; 437/89; 437/90; 437/99; 437/944; 437/947; 148/33.4; 148/DIG. 100; 148/DIG. 161
[58] Field of Search ............ 437/89, 90, 99, 80, 437/944, 947; 148/33.4, DIG. 100, DIG. 161

[56] References Cited

U.S. PATENT DOCUMENTS

| | | | |
|---|---|---|---|
| 3,995,303 | 11/1976 | Nahory et al. | 357/30 |
| 4,111,725 | 9/1978 | Cho | 148/175 |
| 4,447,904 | 5/1984 | Burnham | 437/80 |
| 4,551,394 | 11/1985 | Betsch | 428/641 |
| 4,587,717 | 5/1986 | Daniele | 29/569 |
| 4,614,564 | 9/1986 | Shelson | 156/657 |
| 4,883,770 | 11/1989 | Dohler et al. | 437/110 |
| 4,910,164 | 5/1990 | Shichijo | 437/90 |

OTHER PUBLICATIONS

Selective Lift-off for Preferential Growth with Molecular Beam Epitaxy.
A. Y. Cho et al. IEEE Jr., Electron Device p. 1186, ED-24, No. 9, Sep. 1977.
Patterned growth of gallium arsenide on silicon R. J. Matyi J. Vac. Sci & Tech B 6(2) 699, 1988.
Selective area growth of GaAs/AlxGa1-xAs multilayer structures with MBE using Si shadow masks Appl. Phys. Lett. 31(4) 301, 1977, W. T. Tsang.
Growth and patterning of AgAs/Ge single crystal layers on Si substrates by MBE, P. Sheldon Appl. Phys. Lett 45(3) 274, 1984.

Primary Examiner—Olik Chaudhuri
Assistant Examiner—Ourmazd Ojan
Attorney, Agent, or Firm—Melvin Sharp; James T. Comford; N. Rhys Merrett

[57] ABSTRACT

Shadow masking layer (130) is undercut during etch of sidewall layer (120) thus preventing sidewall growth during growth of heteroepitaxial region (140), resulting in a planar structure with a high integrity of crystal in the grown region (140).

5 Claims, 5 Drawing Sheets

METHOD FOR PATTERNED HETEROEPITAXIAL GROWTH

BACKGROUND OF THE INVENTION

1. Field of the Invention

This invention relates to the growth of semiconductor materials and devices, and more particularly, to patterned heteroepitaxial growth of a first semiconductor (such as gallium arsenide) on a masked second semiconductor (such as silicon oxide masked silicon) and devices in such heterostructures.

2. Description of the Related Art

Many researchers have investigated growth of semiconductor-device quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fisher et al, GaAs/AlGaAs Heterojunction Bipolar Transistors on Si Substrates, 1985 IEDM Tech. Digest 332, report GaAs/AlGaAs heterojunction bipolar transistors grown on silicon substrates and having current gains of $\beta=13$ for a 0.2 $\mu$m thick base. Similarly, G. Turner et al, Picosecond Photodetector Fabricated in GaAs Layers Grown on Silicon and Silicon On Sapphire Substrates, 1985 IEDM Tech. Digest 468, report response times of 60 picoseconds for photoconductive detectors fabricated in GaAs on silicon. These articles also note that majority carrier devices such as MESFETs fabricated in GaAs on silicon have performance approaching that of homoepitaxial devices; and this has encouraged efforts to integrate GaAs/AlGaAs optoelectronic and high-frequency devices and silicon devices on the same wafer to utilize high-data-rate optical interconnections to reduce the number of wire interconnections. Selective recrystallization of amorphous GaAs can use the high resistivity of noncrystalline GaAs; see, for example, A. Christou et al, Formation of (100) GaAs on (100) Silicon by Laser Recrystallization, 48 Appl. Phys. Lett. 1516 (1986).

One of the principal reasons for the increasing activity in the epitaxial growth of GaAs on silicon substrates is the prospect of monolithic integration of GaAs and Si devices in the same structure. In order to achieve this goal, however, it will be necessary to develop material growth and device processing techniques that will permit the coexistance of circuit elements with vastly different fabrication requirements. One of the most promising of these approaches is the patterned growth of GaAs onto a silicon substrate through openings in a protective mask of either silicon nitride ($Si_3N_4$) or silicon dioxide ($SiO_2$). In this scheme, the fabrication of the silicon based devices (which typically require high temperature processing) would be completed prior to the deposition of a protective oxide or nitride overlayer. Single crystal GaAs could then be grown into lithographically defined holes in the overlayer, and GaAs device fabrication would follow.

Previous work has established that epitaxial GaAs can be successfully deposited onto silicon substrates through a patterning mask; see B.Y. Tsaur et al, 41 Appl Phys. Lett. 347 (1982), P. Sheldon et al, 45 Appl. Phys. Lett. 274 (1984), Daniele et al, U.S. Pat. No. 4,587,717, and Betsch et al, U.S. Pat. No. 4,551,394. In addition, the integration of Si and GaAs device structures via this technology has been demonstrated; see H. K. Choi et al, 7 IEEE Elec. Dev. Lett 241 and 500 (1986) and H. K. Choi et al, Heteroepitaxy on Silicon, J. C. C. Fan and J. M. Poate Eds., 67 MRS Symposia Proceedings 165 (1986).

It is now well established that the differences in lattice parameters and thermal expansion coefficients between Si and GaAs creates an extensive network of dislocations that can limit the performance of GaAs devices. This situation would be exacerbated when the GaAs is deposited through holes in a mask onto a silicon surface by molecular beam epitaxy (MBE). Due to the nonselective nature of MBE growth, the single crystal GaAs regions would be in intimate contact with the polycrystalline GaAs that would grow on the amorphous mask material. The presence of this extra defective interface would naturally be expected to serve as a source for addition crystallographic defects. Similar effects are expected with other growth methods such as metalorganic chemical vapor deposition (MOCVD).

The simplest avenue for the patterned growth of GaAs on Si would involve the epitaxial growth of the GaAs onto the original planar silicon surface. However, the final level of the GaAs surface where device fabrication occurs may be several microns above the the level of prefabricated silicon devices. This situation would naturally complicate the interconnect of the two device structures by conventional metallization schemes. Indeed, for integrated circuits with both digital silicon and digital GaAs devices on an underlying silicon substrate, the coplanarity between the surface of the GaAs regions and the surface of the silicon substrate is essential. One method to achieve this coplanarity is by forming recesses in the silicon substrate where the GaAs regions are to be located and then growing a GaAs layer until the surface of the GaAs in the recesses is coplanar with the surface of the silicon substrate outside of the recesses. Typically the recesses will be about two to three microns deep.

A disadvantage of the known methods of forming the GaAs epitaxial region in recesses in the silicon is the competition that will result between GaAs growing on the essentially or nearly planar bottom of the recess and GaAs growing on the sidewall of the recess. Researchers have shown that GaAs grown on the sidewalls of a recess formed in a silicon substrate contains a much greater density of defects than the GaAs grown on the floor of the trench. This has been attributed to the lack of orientation control of the silicon sidewall. See Matyi et al, 6 J. Vac. Sci. Technol. 699 (1988).

Various methods have been employed to overcome the problems associated with poor quality crystal growth on recess sidewalls. One such method has been to use a preferential etch to undercut the edges of the recessed region, thus forming a shadow mask for subsequent GaAs epitaxial growth using molecular beam epitaxy (MBE). However, such preferential etching is highly dependent upon crystal orientation. Therefore, recesses not aligned along the proper crystal orientation will not exhibit the desired undercutting and will therefore not provide the desired shadow masking by the recess edge, as discussed by Tsang et al, Growth of GaAs-Ga$_{1-x}$Al$_x$As over preferentially etched channels by molecular beam epitaxy: A technique for two-dimensional thin-film definition, 30 Appl. Phy. Lett. 293 (1977).

Mechanical shadow masks have also been used to form patterned growth regions of GaAs epitaxial layers. Tsang et al, Selective area growth of GaAs/Al$_x$-

$Ga_{1-x}As$ multilayer structures with molecular beam epitaxy using Si shadow masks, 31 Appl. Phys. Lett. 301 (1977) describes a method of using a patterned silicon mask placed in contact with a GaAs substrate to define regions of patterned GaAs epitaxial growth. Although Tsang et al discuss forming the patterned epitaxial regions on the substrate surface, the technique could also be used to from patterned epitaxial regions in recesses in the substrate. However, because a mechanical mask is required, orientation and alignment of the patterned growth epitaxial layer with previously formed layers and recesses is difficult. Additionally, the mechanical masks are expensive and difficult to produce.

Thus the known methods of forming planarized GaAs regions in a silicon without the problems of sidewall growth are either limited to certain crystal orientations, or require a mechanical shadow mask with its concomitant alignment limitations.

SUMMARY OF THE INVENTION

The present invention provides heteroepitaxial structures of a first semiconductor (e.g. GaAs) in the recesses of a second semiconductor (e.g. silicon) yielding a planar product and integrated circuits with devices of both the first semiconductor and the second semiconductor on the same chip. The invention also provides a method of heteroepitaxy by the steps of deposition of a layer of the first semiconductor on a masked and recessed material of the second semiconductor followed by removal of the portions of the first material not located in the recess by lift-off of the mask. This method is "self-aligned" in that the mask which defines the regions where the first semiconductor material is desired, is used to lift off excess first semiconductor material from those regions where it is not desired.

This method yields regions of the first semiconductor material in the recesses of the second semiconductor material with the surfaces of the regions and the substrate being coplanar and the self-alignment avoids the problems of poor crystal growth of the first semiconductor at the interface with the sidewalls of the second semiconductor material.

BRIEF DESCRIPTION OF THE DRAWINGS

The drawings are schematic for clarity.

DESCRIPTION OF THE PREFERRED EMBODIMENTS

Figure 1A:
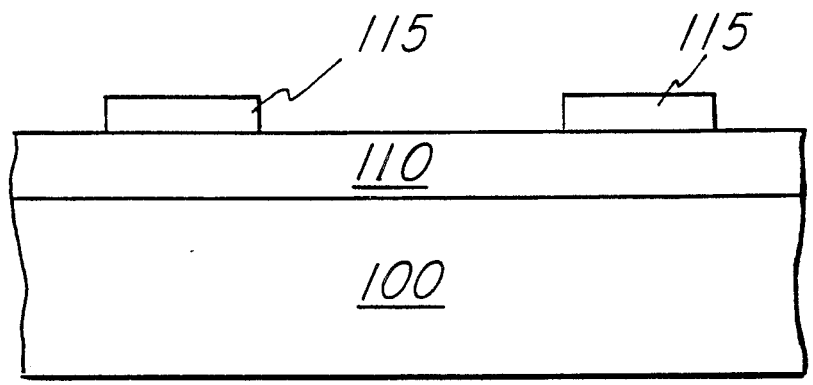
FIGS. 1a-d are cross sectional elevation views of steps of a first preferred embodiment method.
Figure 1B:
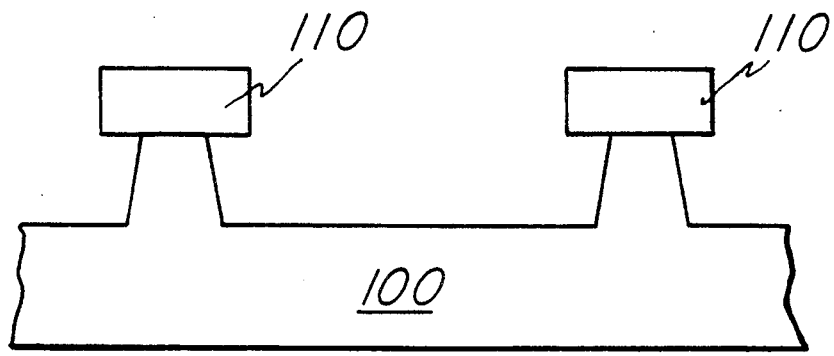

FIGS. 1a-d illustrate in cross sectional elevation view steps of the first preferred embodiment method of formation of single crystal GaAs regions 120 in recesses in single crystal silicon substrate 100 as follows:

(a) Begin with a four inch diameter silicon wafer oriented in the <100> direction and doped p—. Substrate 100 may contain various devices such as MOS and bipolar transistors and interconnections for such devices away from the regions where GaAs is to be deposited. Deposit 5,000 Å of silicon dioxide (oxide) 110 on the surface of substrate 100. Spin on and pattern (expose through a mask and develop) photoresist to define the locations for recesses in substrate 100. The recesses may be of any convenient size and shape such as squares, 10 μm on a side. Etch recesses into silicon substrate 100 with a mixture of KOH and water. The anisotropic etch will result in a smooth surface on the floor of the resulting recess, and will also result in some undercutting of the edge of oxide masking layer 110. The recesses are etched to 3 μm deep which results in about 2 μm of undercutting, as shown in FIG. 1b. At this point photoresist layer 115 can be removed by ashing or by treatment with an organic solvent.

Figure 1C:
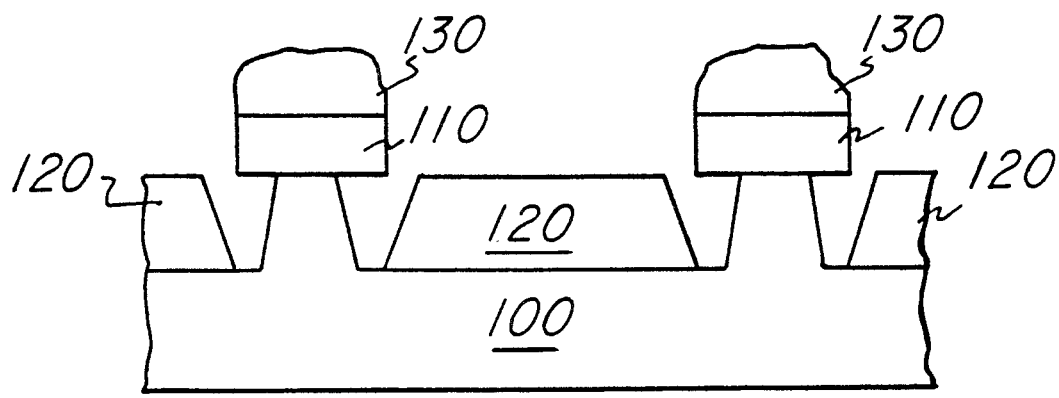
Figure 1D:
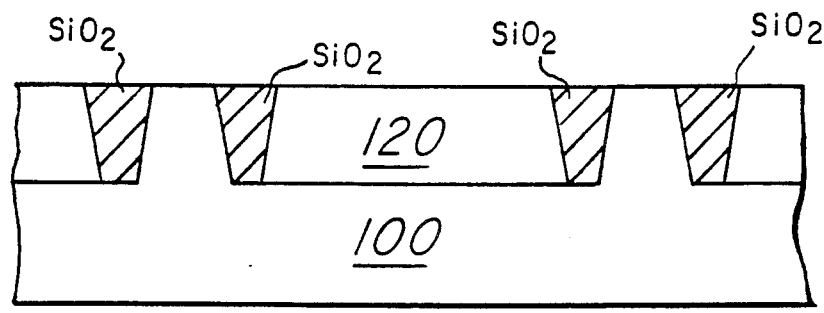

(b) After etching, the wafers are rinsed thoroughly with deionized water and then loaded into a MBE reactor. A GaAs layer equal in thickness to the depth of the recess, i.e. about 3 μm is grown. Growth rates are about 1 μm/hr at a temperature of about 525 degrees C. This growth results in a thin (200 Å) defect layer at the GaAs to silicon interface but is single crystal GaAs 120 over this interface and polycrystalline GaAs 130 over oxide layer 110, as shown in FIG. 1c. Note that oxide layer 110 forms a cantilever shadow mask which overhangs the sidewalls of the recessed region of silicon substrate 100. This overhang is due to the undercutting which occurred during the silicon etch step. The result of the cantilever shadow mask is to prevent the growth of GaAs material on the sidewalls of the recess, thus avoiding the problems of high defect density GaAs associated with sidewall growth.

(c) Expose the structure to a buffered HF etch to remove oxide layer 110. This causes polycrystalline GaAs 130 to be lifted off from the structure. Voids between the sidewalls of the recessed regions and single crystal regions 120 can then be filled through a repetitive process of oxide deposition and etching resulting in the structure illustrated in FIG. 1d.

Figure 2A:
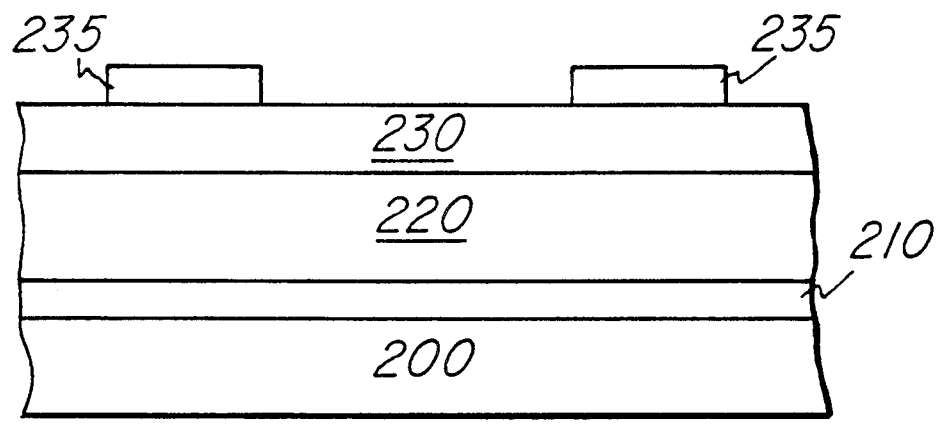
FIGS. 2a-e are cross sectional elevation views of steps of a second preferred embodiment methodl.
Figure 2B:
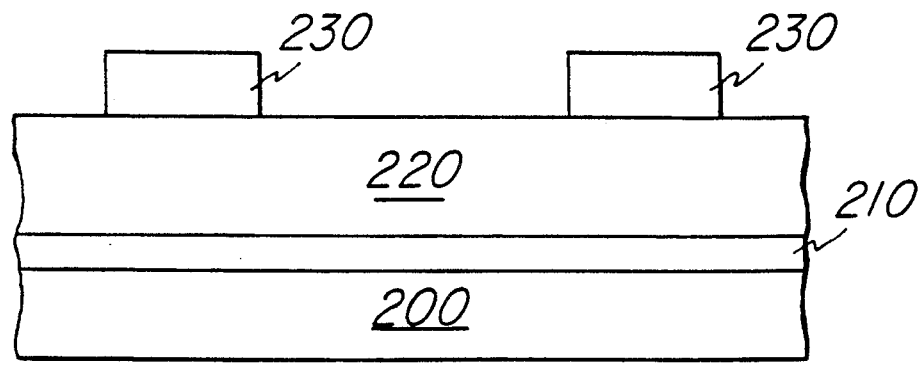
Figure 2C:
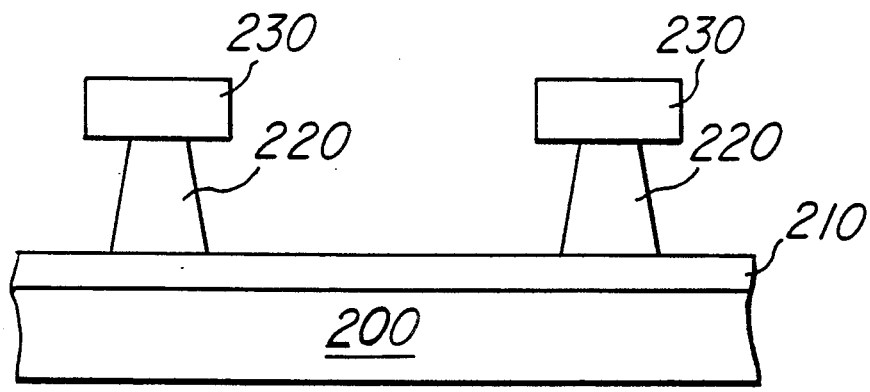

A second preferred embodiment method forms polysilicon sidewalls above a silicon substrate to define a region for patterned heteroepitaxial GaAs growth, as follows:

(a) Start with a silicon wafer of the type described in the first preferred embodiment, and shown in FIG. 2a. Substrate 200 may contain various devices such as MOS and bipolar transistors and interconnections for such devices away from the regions where GaAs is to be deposited. Deposit 500 Å silicon dioxide layer 210. This thin oxide layer will act as an etch stop in future processing. Deposit 3 μm polysilicon layer 220. This polysilicon layer will define the sidewalls or regions for patterned growth. Deposit oxide layer 230 on polysilicon layer 220. Oxide layer 230 is 2000 Å thick and is used as a masking layer during etch of polysilicon layer 220. Spin photoresist 235 onto oxide 230, and pattern (expose through a mask and develop) the photoresist to define the locations of windows to be opened in the oxide. These windows correspond to the location, size and shape of the cantilever shadow mask which will be formed from polysilicon layer 220. Etch oxide layer 230 using photoresist layer 235 as a pattern. At this point photoresist 235 is removed by ashing or by treatment with an organic solvent. The resulting structure is shown in FIG. 2b. Etch polysilicon layer 220 partially using reactive ion etching (RIE) with patterned oxide layer 230 serving as a masking layer. Typically, oxide layer 230 is etched approximately 1 μm with the reactive ion etch treatment. This is followed by a wet etch using an isotropic silicon etch, such as HNO$_3$:HF:CH$_3$COOH. The isotropic wet etch causes undercutting of oxide layer 230. The amount of this undercutting is controlled by the amount of polysilicon layer 220 that is removed by reactive ion etching. The more of polysilicon layer 220 that is removed by reactive ion etching, the less time required to etch through the layer with isotropic etching, and hence the less undercutting that occurs. Typically about 2 μm of undercutting occurs when polysilicon layer 220 is etched through with the isotropic etch after being etched 1 μm with the RIE. Thin oxide layer 210 acts as an etch stop to prevent the etchant from affecting the surface of silicon substrate 200. The resulting structure is illustrated in FIG. 2c. Strip oxide layer 210 with a buffered HF solution and prepare the structure for epitaxial growth in a MBE reactor.

Figure 2D:
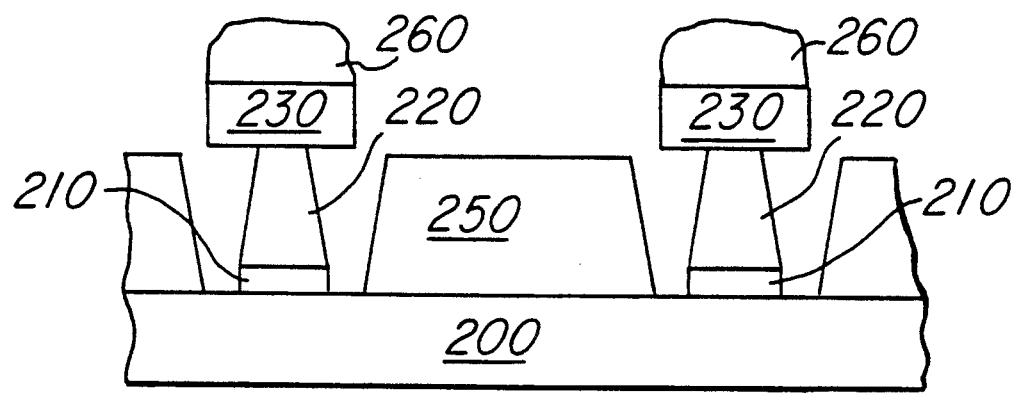

(b) The structure is placed in an MBE reactor and pre-treated with a high temperature oxide desorption step at about 630 degrees C. for about fifteen minutes under an arsenic overpressure. This is followed by epitaxial growth conditions at about 525 degrees C. for approximately three hours, providing a 3 μm thick GaAs layer. As described in the first preferred embodiment, this growth results in a thin (200 Å) defect layer at the GaAs to silicon interface but is single crystal GaAs 250 over this interface and polycrystalline GaAs 260 over oxide layer 230, as shown in FIG. 2d. Note that patterned oxide layer 230 forms a cantilever shadow mask which overhangs the sidewalls of the desired GaAs growth regions defined by patterned polysilicon layer 220. This overhang is due to the undercutting of oxide layer 230 which occured during the etch step. The result of the cantilever shadow mask is to prevent the growth of polycrystalline GaAs material on the polysilicon sidewalls of the region, which would have created a non-usable region of GaAs in the patterned growth region. The slight non-planarity caused by thin oxide 210 is not significant enough to impact interconnecting the GaAs regions. Further, by growing GaAs region 250 thicker, planarity can be achieved.

Figure 2E:
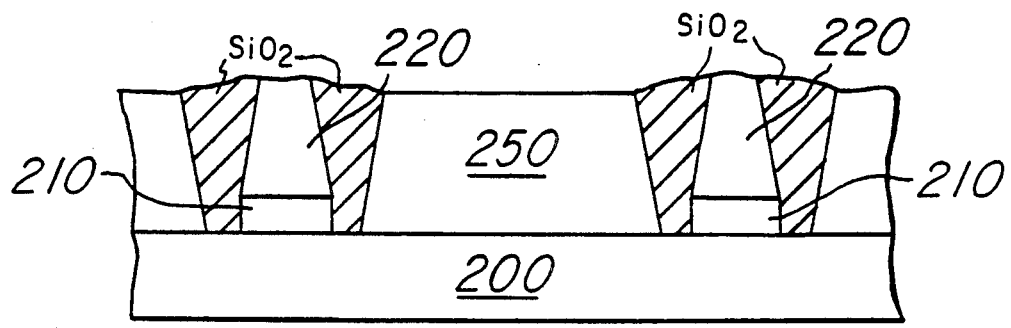

(c) Expose the structure to a buffered HF etch to remove oxide layer 230. This causes polycrystalline GaAs 260 to be lifted off from the structure. Voids between the sidewalls of the recessed regions and single crystal regions 120 can then be filled through a repetitive process of oxide deposition and etching resulting in the structure illustrated in FIG. 2e.

In a third preferred embodiment, patterned regions of InGaAs are heteroepitaxially grown on a GaAs substrate in progressive composition grading steps. By combining progressive composition grading with reduced area growth free from sidewall growth interactions, significant dislocation reduction can be realized for large lattice mismatched systems such as InGaAs/GaAs.

Figure 3A:
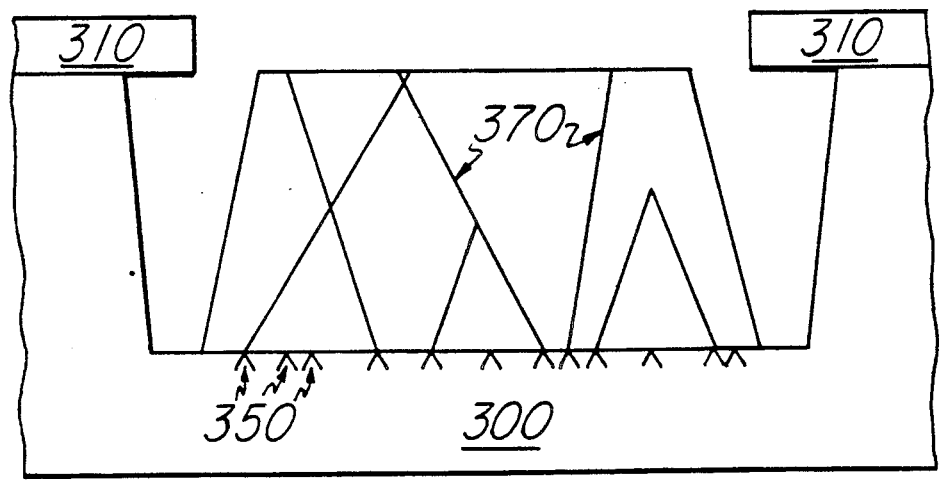
FIG. 3a is a cross sectional elevation view of the resulting structure of a first preferred embodiment using an InGaAs epitaxial region and a GaAs substrate.

FIG. 3a illustrates schematically in sectional elevation view In$_{0.25}$Ga$_{0.75}$As region 320 heteroepitaxially grown in a recess in GaAs substrate 300 which has been etched and undercut using oxide layer 310 as a shadow mask to prevent sidewall growth. Misfit dislocations 350 arise from the lattice mismatch between In$_{0.25}$Ga$_{0.75}$As and GaAs. Threading dislocations 370 arise from interactions during the formation of the misfit dislocations 350. These threading dislocations can propagate to the surface of the region as shown in FIG. 3a and cause performance degradation of the material. Because the In$_{0.25}$Ga$_{0.75}$As was grown in small areas without sidewall growth, some of the dislocations are able to propagate to the edges of the In$_{0.25}$Ga$_{0.75}$As region and relieve the stress. This would not be possible if sidewall In$_{0.25}$Ga$_{0.75}$As growth had occurred, because the high defect density of the sidewall growth region would bind up the misfit dislocations, thus preventing them from propagating to the edges of the In$_{0.25}$Ga$_{0.75}$As region.

Figure 3B:
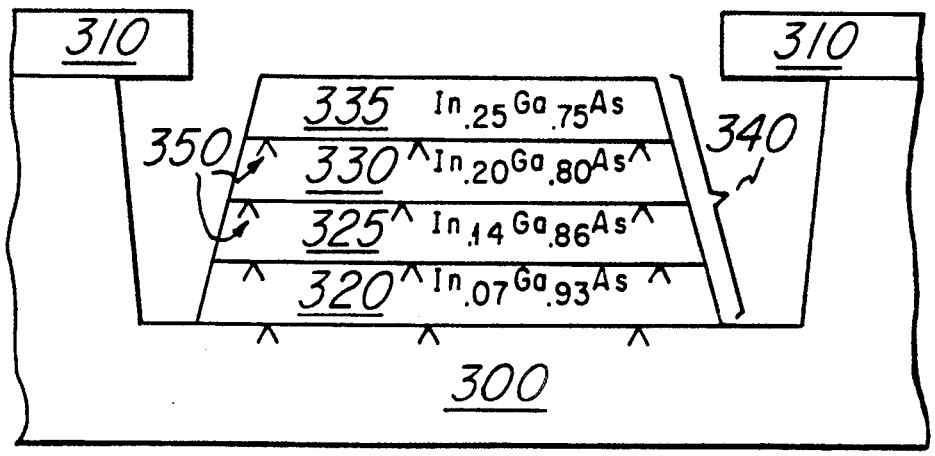
FIG. 3b is a cross sectional elevation view of the resulting structure of a third preferred embodiment.

The crystal structure can be further improved by growing the InGaAs heteroepitaxial region in composition graded layers as illustrated in FIG. 3b. As illustrated InGaAs region 340 is grown in the recess of GaAs substrate 300 which has been etched and undercut using oxide layer 310 as a shadow mask to prevent sidewall growth. InGaAs region 340 is composed of layers of InGaAs which have progressively higher concentrations of indium. In$_{0.07}$Ga$_{0.93}$As layer 320, which is grown first, has the closest lattice match to GaAs substrate 300, thus producing few misfit dislocations. In$_{0.14}$Ga$_{0.86}$As layer 325 has a close lattice match to In$_{0.07}$Ga$_{0.93}$As layer 320, so few misfit dislocations are required. Because the resulting structure requires fewer misfit dislocations 350 because of the incremental steps in the lattice mismatch, interaction between misfit dislocations is reduced. Furthermore, because of the reduced area of the InGaAs region and absence of defective sidewall growth regions, the misfit locations are able to propagate to the edges of the region and relieve the stress, resulting in an improved crystal structure.

The formation of GaAs 250 in regions defined by polysilicon sidewalls 220 by the preferred embodiment methods and standard GaAs processing are relatively low temperature processes, usually below 800 degrees C. to prevent arsenic out-diffusion, so circuitry formed in the silicon surface regions of substrate 102 away from GaAs 104 could include materials such as silicides and tungsten. After formation of GaAs regions 1250, devices such as light emitting diodes (LEDs) and surface emitting lasers (SELs) may be fabricated in GaAs regions 104 by standard processing. By forming an array of GaAs regions 250 using an array of polysilicon sidewalls 220 a dense array of GaAs devices can be fabricated and interconnected to one another and to the circuitry formed in silicon using the polysilicon sidewalls as interconnects. Any aluminum or gold metallization would be applied after devices had been fabricated in GaAs 104.

Figure 4:
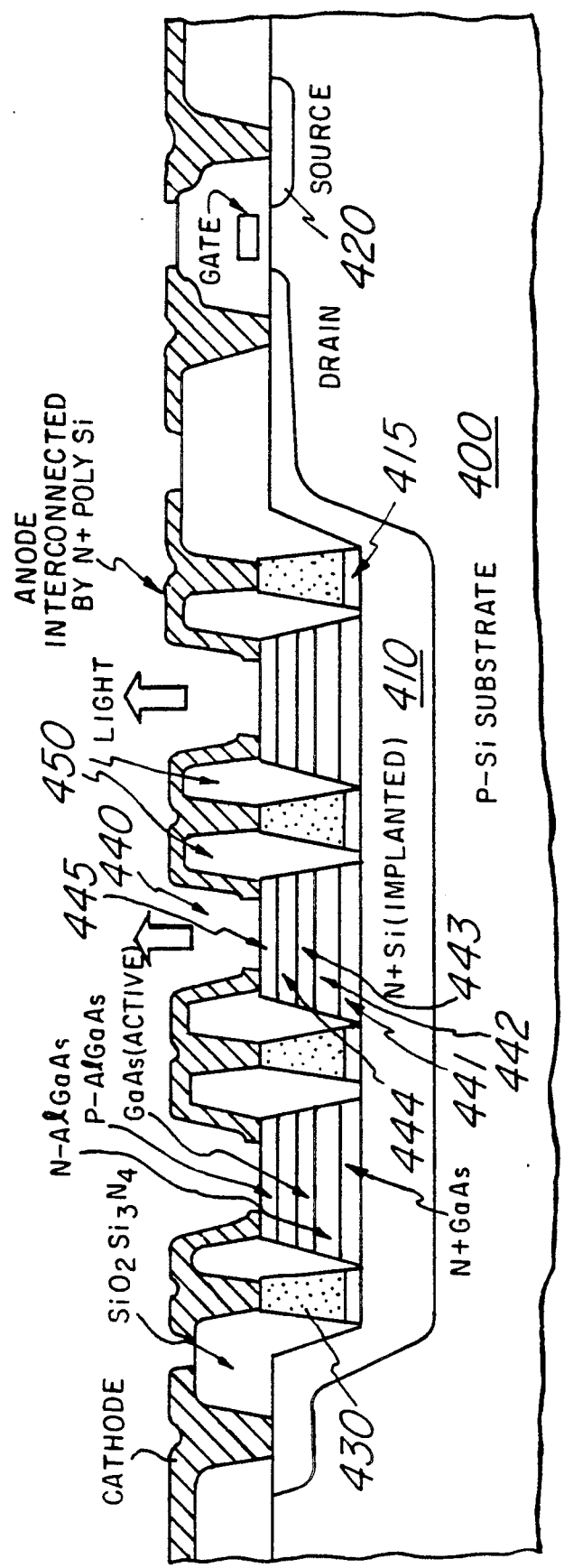
FIG. 4 illustrates in cross sectional view a dense GaAs LED array interconnected with silicon devices.

FIG. 4 schematically illustrates a dense array of AlGaAs/GaAs LEDs formed in a trench in silicon substrate. A 3 μm deep trench is etched in silicon wafer 400 followed by implant of n+ regions to form silicon MOSFET source regions 420 and MOSFET drain regions and LED cathode regions 410. The structure is then covered with silicon nitride layer 415 to protect the surface of silicon substrate 400 during subsequent processing. Openings are formed in nitride layer 415 where heteropitaxial GaAs growth is desired, using photolithographic techniques. As in the second preferred embodiment method, n+ polysilicon sidewalls 430 are formed by depositing a polysilicon layer, then depositing an oxide layer and patterning the oxide layer photolithographically. Polysilicon layer 430 is then etched isotropically, undercutting the oxide layer, resulting in the cantilever shadow mask described in the second preferred embodiment. The polysilicon sidewalls are isolated from the underlying n+ implant region 420 by underlying nitride layer 415.

GaAs LED 440 is of a type known in the art, comprising 2 μm thick n+ doped GaAs layer 441, 0.5 μm thick n—doped AlGaAs confinement layer 442, 0.005 μm thick active GaAs layer 443, 1 μm thick p+ doped AlGaAs layer 444, and 0.1 μm thick p—doped GaAs layer 445. The layers are grown using standard MBE techniques and growth on the polysilicon sidewalls is prevented by the oxide shadow mask. After growth of the heteroepitaxial layers, the shadow mask oxide layer is etched off as described in the preferred embodiment methods, thus lifting off the polycrystalline GaAs which grew on the exposed oxide layer.

Silicon dioxide layer 450 is deposited over the structure to fill in the voids created by the shadow mask oxide between GaAs region 440 and polysilicon sidewalls 430. Contact windows are photolithographically formed and etched in oxide layer 450 and metallic interconnects formed between the GaAs LEDs in the array and associated silicon driving circuitry, as shown in FIG. 4. The resulting structure contains both silicon devices and GaAs devices monolithically integrated on the same substrate with very good planarity between the two types of devices and hence interconnection is facilitated. The n-doped polysilicon sidewalls are used as interconnects for the GaAs LEDs.

MODIFICATIONS AND ADVANTAGES

Various modifications of the preferred embodiment devices and methods may be made while retaining the features of a shadow mask layer which prevents heteroepitaxial growth on the sidewalls of heteroepitaxial growth regions and which can be removed to lift off the unwanted portion of the grown layer yielding a planar structure.

For example, other semiconductor materials may be used for growing layers, such as other III-V compounds or even II-VI compounds; the shadow masking layer could be silicon nitride or some other material resistant to silicon etch methods; the recessed material may be other materials such as silicon-on-insulator, germanium, compound semiconductors, or other complex structures including a heavily doped silicon substrate with a lightly doped epilayer containing p and n wells for CMOS devices and bipolar regions together with trench isolation between the regions as in BiCMOS; other devices such as heterojunction bipolar transistors, may be fabricated in the GaAs regions; the dimensions and shapes of the recesses may be varied such as some deep recesses that are filled by a second application of the preferred embodiment methods; voids between the grown regions and the sidewalls could be filled with silicon nitride or left unfilled; and various other crystal-defect improvement techniques such as growth of superlattices and capped in situ annealing could be used to improve the crystal structure of the heteroepitaxial regions.

The invention provides the advantage of planar regions of a first semiconductor in a layer of a second semiconductor without the high density of defects associated with sidewall growth.

What is claimed is:

1. A method for heteroepitaxial growth, comprising the steps of:
   (a) forming a layer of first material on a semiconductor substrate;
   (b) selecting an etchant, said etchant selected to preferentially dissolve said first material at a slower rate than said semiconductor substrate;
   (c) opening a window in said layer of first material to expose a region of said semiconductor substrate;
   (d) introducing said etchant to etch a recess in said exposed region of said semiconductor substrate, said recess comprising sidewall portions and a floor portion, said etchant also undercutting the edges of said window, forming a cantilever shadow mask overhanging said sidewalls and the periphery of said floor portion;
   (e) growing a heteroepitaxial layer of a second semiconductor material on said floor portion to a thickness approximately equal to the depth of said recess, said cantilever shadow mask obstructing growth of said heteroepitaxial layer on said sidewalls and the periphery of said floor, resulting in a heteroepitaxial region with a surface substantially coplanar with a surface of the semiconductor substrate and said heteroepitaxial region being spaced apart from said sidewalls;
   (f) removing said first layer and thus lifting off material deposited on said first layer during previous process steps; and
   (g) depositing an insulating material between said heteroepitaxial region and said sidewall portions.

2. The method of claim 1, wherein:
   (a) said semiconductor substrate is silicon.

3. The method of claim 1, wherein:
   (a) said layer of first material is polysilicon.

4. The method of claim 1, wherein:
   (a) said second semiconductor material is substantially gallium arsenide.

5. The method of claim 1, wherein:
   (a) said semiconductor substrate is gallium arsenide;
   (b) said second semiconductor material is indium gallium arsenide; and
   (c) said heteroepitaxial layer is grown in progressive composition steps of increasing indium proportions.

* * * * *